United States Patent
Chung et al.

(10) Patent No.: US 10,718,065 B2
(45) Date of Patent: Jul. 21, 2020

(54) SILICON-BASED MOLTEN COMPOSITION AND MANUFACTURING METHOD OF SIC SINGLE CRYSTAL USING THE SAME

(71) Applicant: LG Chem, Ltd., Seoul (KR)

(72) Inventors: Chan Yeup Chung, Daejeon (KR); Jung Min Ko, Daejeon (KR); Dae Sung Kim, Daejeon (KR); Sung Soo Lee, Daejeon (KR); Chang Sun Eun, Daejeon (KR)

(73) Assignee: LG Chem, Ltd. (KR)

( * ) Notice: Subject to any disclaimer, the term of this patent is extended or adjusted under 35 U.S.C. 154(b) by 120 days.

(21) Appl. No.: 15/574,216

(22) PCT Filed: Oct. 25, 2016

(86) PCT No.: PCT/KR2016/012020
§ 371 (c)(1),
(2) Date: Nov. 15, 2017

(87) PCT Pub. No.: WO2017/073984
PCT Pub. Date: May 4, 2017

(65) Prior Publication Data
US 2018/0127891 A1 May 10, 2018

(30) Foreign Application Priority Data
Oct. 26, 2015 (KR) .................. 10-2015-0148848

(51) Int. Cl.
*C30B 29/06* (2006.01)
*C30B 29/36* (2006.01)
(Continued)

(52) U.S. Cl.
CPC .............. *C30B 29/06* (2013.01); *C30B 9/06* (2013.01); *C30B 9/10* (2013.01); *C30B 19/04* (2013.01); *C30B 29/36* (2013.01); *H01L 21/02* (2013.01)

(58) Field of Classification Search
CPC ............ C30B 29/36; C30B 9/10; C30B 19/02
See application file for complete search history.

(56) References Cited

U.S. PATENT DOCUMENTS

2008/0190355 A1   8/2008   Chen et al.
2009/0038538 A1   2/2009   Kaneko et al.
(Continued)

FOREIGN PATENT DOCUMENTS

JP   2000264790 A   9/2000
JP   2008100890 A   5/2008
(Continued)

OTHER PUBLICATIONS

Search report from International Application No. PCT/KR2016/012020, dated Feb. 10, 2017.
(Continued)

*Primary Examiner* — Matthew J Song
(74) *Attorney, Agent, or Firm* — Lerner, David, Littenberg, Krumholz & Mentlik, LLP

(57) ABSTRACT

Provided is a silicon-based molten composition including silicon, carbon, and a metal in which a solubility parameter ($C_{si}^{sol}$) defined by Equation (1) below is less than −0.37, wherein a SiC single crystal is formed by a solution method:

$$C_{si}^{sol} = A - B + \mu_1 - \mu_2 \qquad \text{Equation (1)}$$

in Equation (1) above, A is a first energy (A) of a first evaluation lattice including silicon atoms, a carbon atom, and metal atoms in a silicon crystal lattice including metals and carbons, B is a second energy (B) of a second evaluation lattice including silicon atoms and metal atoms in a silicon (Continued)

crystal lattice including metals, $\mu1$ is a constant of $-5.422$, and $\mu2$ is a constant of $-9.097$.

10 Claims, 4 Drawing Sheets

(51) Int. Cl.
*H01L 21/02* (2006.01)
*C30B 9/10* (2006.01)
*C30B 19/04* (2006.01)
*C30B 9/06* (2006.01)

(56) References Cited

U.S. PATENT DOCUMENTS

| | | |
|---|---|---|
| 2009/0178610 A1 | 7/2009 | Sakamoto et al. |
| 2009/0194017 A1 | 8/2009 | Terashima et al. |
| 2010/0083896 A1 | 4/2010 | Sakamoto |
| 2012/0132130 A1 | 5/2012 | Nomura et al. |
| 2012/0237428 A1 | 9/2012 | Ryo et al. |
| 2013/0042802 A1 | 2/2013 | Danno et al. |
| 2014/0205837 A1 | 7/2014 | Choi et al. |
| 2015/0159297 A1 | 6/2015 | Shinya et al. |
| 2015/0159299 A1* | 6/2015 | Shinya ............ C30B 13/02 117/35 |
| 2015/0167196 A1 | 6/2015 | Kado et al. |
| 2016/0068993 A1* | 3/2016 | Shirai ............ C30B 9/06 257/77 |
| 2016/0208411 A1 | 7/2016 | Shirai |
| 2016/0273126 A1 | 9/2016 | Kusunoki et al. |
| 2016/0340795 A1* | 11/2016 | Domoto ............ C30B 15/14 |
| 2017/0170279 A1 | 6/2017 | Domoto et al. |
| 2017/0370018 A1* | 12/2017 | Domoto ............ C30B 15/20 |
| 2018/0016703 A1* | 1/2018 | Domoto ............ C30B 19/04 |

FOREIGN PATENT DOCUMENTS

| | | |
|---|---|---|
| JP | 2009184879 A | 8/2009 |
| JP | 4561000 B2 | 10/2010 |
| JP | 4811354 B2 | 11/2011 |
| JP | 2012111669 A | 6/2012 |
| JP | 2013209274 A | 10/2013 |
| JP | 5483216 B2 | 5/2014 |
| JP | 2015067489 A | 4/2015 |
| JP | 2015110496 A | 6/2015 |
| JP | 5741652 B2 | 7/2015 |
| KR | 20110086986 A | 8/2011 |
| KR | 101070412 B1 | 10/2011 |
| KR | 20120057536 A | 6/2012 |
| KR | 20140094831 A | 7/2014 |
| KR | 20150023031 A | 3/2015 |
| KR | 20150066458 A | 6/2015 |
| KR | 20150066459 A | 6/2015 |
| KR | 20170040660 A | 4/2017 |
| WO | 2011007458 A1 | 1/2011 |
| WO | 2015072136 A1 | 5/2015 |
| WO | 2015115543 A1 | 8/2015 |
| WO | 2015129876 A1 | 9/2015 |

OTHER PUBLICATIONS

Tajima, et al., "Solid Solubility of Aluminum and Boron in Silicon Carbide." Communications of the American Ceramic Society, Feb. 1982, pp. C-27-C-29.

Hähnel, A., et al., "Nanostructuring in Ni/SiC reaction layers, investigated by imaging of atomic columns and DFT calculations." Materials Chemistry and Physics, vol. 114, 2009, pp. 802-808.

Extended European Search Report including Written Opinion for Application No. EP168601672 dated Oct. 4, 2018.

* cited by examiner

SILICON-BASED MOLTEN COMPOSITION AND MANUFACTURING METHOD OF SIC SINGLE CRYSTAL USING THE SAME

CROSS REFERENCE TO RELATED APPLICATIONS

The present application is a national phase entry under 35 U.S.C. § 371 of International Application No. PCT/KR2016/012020 filed Oct. 25, 2016, which claims priority from Korean Patent Application No. 10-2015-0148848 filed on Oct. 26, 2015 with the Korean Intellectual Property Office, the disclosures of which are hereby incorporated by reference.

TECHNICAL FIELD

The present invention relates to a silicon-based molten composition, and a manufacturing method of a SiC single crystal using the same.

BACKGROUND ART

A SiC single crystal has been studied as a substrate for a power semiconductor device. The SiC single crystal has excellent bandgap and dielectric breakdown strength as compared to conventional silicons. The semiconductor using such a SiC substrate may be used with high power and may minimize loss due to energy conversion.

In addition, since the device including the SiC substrate is operated at a high temperature, it is possible to prevent device breakdown due to heat release and it is expected to simplify a cooling device, and thus, the device including the SiC substrate may be utilized as a next generation power semiconductor device to replace the silicon.

As a growth method for the SiC single crystal, a sublimation method, a CVD method, an Acheson method, a solution method, and the like, are known. Among them, the solution method is a method of dissolving silicon or a silicon-containing alloy in a crucible, and then precipitating and growing a SiC single crystal on a seed crystal from a molten solution containing silicon and carbon.

DISCLOSURE

Technical Problem

The present invention has been made in an effort to provide a silicon-based molten composition, and a manufacturing method of a SiC single crystal using the same, and specifically, to provide a silicon-based molten composition including a metal having a predetermined level of a solubility parameter ($C_{si}^{sol}$) value, thereby having improved carbon solubility, and a manufacturing method of a SiC single crystal using the same.

Technical Solution

An exemplary embodiment of the present invention provides a silicon-based molten composition including silicon, carbon, and a metal in which a solubility parameter ($C_{si}^{sol}$) defined by Equation (1) below is less than −0.37, wherein a SiC single crystal is formed by a solution method:

$$C_{si}^{sol} = A - B + \mu_1 - \mu_2 \qquad \text{Equation (1)}$$

in Equation (1) above, A is a first energy (A) of a first evaluation lattice including silicon atoms, a carbon atom, and metal atoms in a silicon crystal lattice including metal atoms and carbon atoms, B is a second energy (B) of a second evaluation lattice including silicon atoms and metal atoms in a silicon crystal lattice including metal atoms, $\mu_1$ is a constant of −5.422 as a chemical potential obtained by dividing a total energy of silicon in a diamond crystal structure into the number of silicon atoms present in a unit lattice, and $\mu_2$ is a constant of −9.097 as a chemical potential obtained by dividing a total energy of carbon in the diamond crystal structure into the number of carbon atoms present in the unit lattice.

The metal may have a value of $-0.90 < C_{si}^{sol} < -0.38$ with respect to the solubility parameter ($C_{si}^{sol}$) defined by Equation (1) above. The metal may include two or more metals.

The metal may include at least two selected from the group consisting of aluminum (Al), titanium (Ti), zirconium (Zr), chromium (Cr), and scandium (Sc).

The metal may have a content of 25 to 85 parts by weight based on 100 parts by weight of a total content of the silicon.

The metal may have a content of 60 to 70 parts by weight based on 100 parts by weight of the total content of the silicon. Another embodiment of the present invention provides a manufacturing method of a SiC single crystal including: preparing a SiC seed crystal, preparing a molten solution including silicon, carbon, and a metal, and growing a SiC single crystal on the SiC seed crystal by supercooling the molten solution, wherein the metal has a solubility parameter ($C_{si}^{sol}$) of less than −0.37 as defined by Equation (1) below:

$$C_{si}^{sol} = A - B + \mu_1 - \mu_2 \qquad \text{Equation (1)}$$

in Equation (1) above, A is a first energy (A) of a first evaluation lattice including metal atoms, a carbon atom, and silicon atoms in a silicon crystal lattice including metal atoms and carbon atoms, B is a second energy (B) of a second evaluation lattice including silicon atoms and metal atoms in a silicon crystal lattice including metal atoms, $\mu_1$ is a constant of −5.422 as a chemical potential obtained by dividing a total energy of silicon in a diamond crystal structure into the number of silicon atoms present in a unit lattice, and $\mu_2$ is a constant of −9.097 as a chemical potential obtained by dividing a total energy of carbon in the diamond crystal structure into the number of carbon atoms present in the unit lattice.

An interatomic force acting on the silicon atoms, the carbon atom, and the metal atoms in the first evaluation lattice may be ±0.01 eV/Å or less.

An interatomic force acting on the silicon atoms and the metal atoms in the second evaluation lattice may be ±0.01 eV/Å or less.

The first energy may be derived by substituting the silicon atoms with the metal atoms in the silicon crystal lattice, and substituting the silicon atom with the carbon atom to form the first evaluation lattice.

The second energy may be derived by substituting the silicon atoms with the metal atoms in the silicon crystal lattice to form the second evaluation lattice.

The metal atoms may include a first metal atom and a second metal atom that are different from each other, and a distance between the first metal atom and the second metal atom may be 5 Å or less.

The first evaluation lattice may include the carbon atom, the silicon atoms, and the metal atoms positioned within a radius of 6 Å based on the carbon atom.

The second evaluation lattice may include the silicon atoms and the metal atoms positioned within a radius of 6 Å based on the silicon atom adjacent to the metal atoms.

The first energy, the second energy, the first constant, and the second constant may be derived by a density functional theory (DFT) using a VASP code.

Advantageous Effects

The above-described silicon-based molten composition may include a metal having a predetermined level of solubility parameter value, and the metal may improve carbon solubility with respect to the molten silicon-based composition. In addition, by improving the solubility, an efficiency in which the SiC single crystal is obtained may be improved.

MODE FOR INVENTION

Figure 1:
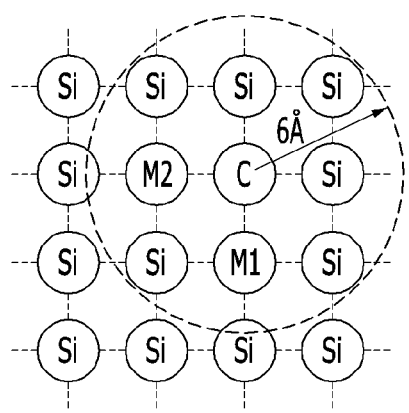
FIG. 1 is a plan view of a first evaluation lattice according to an exemplary embodiment of the present invention.

Although the present invention may be modified variously and have several embodiments, the exemplary embodiments are illustrated in the accompanying drawings and will be described in detail in the detailed description. However, the present invention is not limited to the specific embodiments and should be construed as including all the changes, equivalents, and substitutions included in the spirit and scope of the present invention.

A silicon-based molten composition according to an exemplary embodiment of the present invention may include silicon, carbon, and a metal in which a solubility parameter ($C_{si}^{sol}$) defined by Equation (1) below is less than $-0.37$. More preferably, the metal may have a value of $-0.90 < C_{si}^{sol} < -0.38$ with respect to the solubility parameter ($C_{si}^{sol}$) defined by Equation (1) below:

$$C_{si}^{sol} = A - B + \mu_1 - \mu_2 \quad \text{Equation (1)}$$

in Equation (1) above, A is a first energy (A) of a first evaluation lattice including metal atoms, a carbon atom, and silicon atoms in a silicon crystal lattice including metal atoms and carbon atoms, B is a second energy (B) of a second evaluation lattice including metal atoms and silicon atoms in a silicon crystal lattice including metal atoms, $\mu_1$ is a constant of $-5.422$ as a chemical potential obtained by dividing a total energy of silicon in a diamond crystal structure into the number of silicon atoms present in a unit lattice, and $\mu_2$ is a constant of $-9.097$ as a chemical potential obtained by dividing a total energy of carbon in the diamond crystal structure into the number of carbon atoms present in the unit lattice.

When the solubility parameter ($C_{si}^{sol}$) value is $-0.37$ or less, it is stable in view of a thermodynamic aspect, which means that carbon solubility with respect to a silicon-based molten solution is excellent.

The metal may include any metal that satisfies the solubility parameter ($C_{si}^{sol}$) value, for example, the metal may include two or more metals.

When the two or more metals have the value of $-0.37$ or less with respect to the solubility parameter defined by Equation (1) above, preferably, any metal combination having a value of $-0.90 < C_{si}^{sol} < -0.38$ with respect to the solubility parameter ($C_{si}^{sol}$) defined by Equation (1) above is possible. For example, the two or more metals may include two or more selected from the group consisting of aluminum (Al), titanium (Ti), zirconium (Zr), chromium (Cr) and scandium (Sc). Specifically, the metal may include a combination of aluminum and scandium, a combination of titanium and zirconium, a combination of scandium and zirconium, a combination of scandium and titanium, a combination of scandium and chromium, etc., and for example, the combination of aluminum and scandium may have a solubility parameter value of $-0.41$ to $-0.39$, or $-0.401$, the combination of titanium and zirconium may have a solubility parameter value of $-0.76$ to $-0.75$ or $-0.758$, the combination of scandium and zirconium may have a solubility parameter value of $-0.81$ to $-0.80$ or $-0.805$, and the combination of scandium and titanium may have a solubility parameter value of $-0.62$ to $-0.61$ or $-0.616$, and the combination of scandium and chromium may have a solubility parameter value of $-0.40$ to $-0.39$, or $-0.394$.

The metal may have a content of 25 to 85 parts by weight based on 100 parts by weight of a total content of the silicon. When the metal has a content of 25 parts by weight or less based on 100 parts by weight of the total content of the silicon, the carbon solubility with respect to the silicon-based molten solution is low and a sufficient growth speed of the SiC single crystal is not obtained. Further, when the metal has a content of 85 parts by weight or more based on 100 parts by weight of the total content of the silicon, polycrystallization of SiC easily occurs, and thus, it may be difficult to grow the single crystal.

In addition, the above-described parts by weight may be satisfied even when the metal includes two or more different metals. Further, a content of any one metal may be larger than a content of the remaining metal.

Accordingly, the metal may have a content of 25 to 85 parts by weight, preferably 60 to 70 parts by weight, based on 100 parts by weight of the total content of silicon, regardless of the kind of the metal.

Further, the metals may also be positioned by substituting for the silicon atoms in the silicon crystal lattice. That is, the metal atoms may be positioned in the silicon crystal lattice.

When the silicon-based molten composition includes the metal having the solubility parameter value in the above-described range, the carbon solubility with respect to the silicon-based molten composition may be excellent.

Hereinafter, a step of deriving the solubility parameter ($C_{si}^{sol}$) defined by Equation (1) above is described in detail. It has been previously described that the silicon-based molten composition of the present invention may include two or more metals, and hereinafter, an embodiment including a first metal atom and a second metal atom is described as an example.

However, the metal is limited thereto, and may be a single metal or may include three or more metals. When the metal is a single metal, a case where the following first and second metal atoms are substituted with a single metal atom may be described, and when the metal includes three or more metals, a case where the following first and second metal atoms are substituted with the first metal atom, the second metal atom, and the third metal atom, etc., may be described.

A step of deriving the first energy (A) is described in more detail.

A silicon crystal lattice having a diamond crystal structure is prepared. The silicon crystal lattice means a 2×2×2 super cell in which a silicon unit cell having a diamond crystal structure is doubled in x, y, and z crystal axis directions, respectively. In addition, preferably, in a k-point mesh in a reciprocal space for calculating an eigenvalue of electrons, a condition including only a gamma point is used.

In particular, the silicon-based molten composition actually has an amorphous structure, but is not able to specify an atomic structure in the amorphous form and has various cases in the same composition. Accordingly, in the step of deriving the first energy according to the exemplary embodiment of the present invention, the silicon crystal lattice is assumed to be a crystal lattice having a three-dimensional periodic boundary condition, and a silicon crystal lattice having a crystalline structure is used in all energy calculations.

Then, one of any silicon atoms in the silicon crystal lattice is substituted with a first metal atom M1, as shown in FIG. 1.

Then, any other silicon atom in the silicon crystal lattice having the substituted first metal atom M1 is substituted with a second metal atom M2.

Here, the first metal atom and the second metal atom are neighboring to each other in a column direction or in a row direction and do not bond to each other. Further, an interval between the first metal atom and the second metal atom is preferably 5 Å or less.

That is, the first metal atom and the second metal atom may be positioned to have the interval of 5 Å or less while opposing each other in a diagonal direction as shown in FIG. 1. However, the metal atom and the second metal atom are not limited to the position, and may be positioned at any position that satisfies the above-described conditions.

After a part of the silicon crystal lattice having the diamond crystal structure is substituted with the first metal atom and the second metal atom as described above, the silicon atom positioned between the first metal atom and the second metal atom is substituted with the carbon atom C.

Next, a structural optimization step is performed so that an interatomic force acting on the silicon atoms, the carbon atom, the first metal atom, and the second metal atom is ±0.01 eV/Å or less.

Specifically, the structural optimization step is performed by performing repeated calculation so that the force acting among the silicon atoms, the carbon atom, the first metal atom, and the second metal atom is the above-described value. Preferably, an optimum atomic structure is sought by performing the repeated calculation until the force acting on each atom obtained through electron energy calculation is less than ±0.01 eV/Å.

Further, in order to obtain a structurally optimized crystal lattice that includes the carbon atom, the first metal atom, the second metal atom, and the silicon atom and, the optimization is performed on a lattice positioned within a radius of 6 Å based on the carbon atom C positioned between the first metal atom M1 and the second metal atom M2. After the structural optimization is completed, the crystal lattice which is positioned within the radius of 6 Å based on the carbon atom positioned between the first metal atom and the second metal atom is defined as the first evaluation lattice.

That is, the first evaluation lattice includes the first metal atom, the second metal atom, the silicon atom, and the carbon atom.

Finally, the first energy (A) which is a total energy of the first evaluation lattice including the carbon atom, the first metal atom, the second metal atom, and the silicon atoms is derived.

Here, the first energy (A) may be derived by a density functional theory (DFT) using a VASP code for a case where the first evaluation lattice is in an electronic ground state.

Specifically, the first energy (A) may be obtained by a plane wave-based density functional theory using a VASP code. For an exchange correlation for simulating electron-electron interactions in density functional theory-based calculations, the Perdew-Burke-Ernzerhof (PBE) function of generalized gradient approximation (GGA) is used. Further, kinetic energy cut off of electrons is 400 eV, and the energy smearing is performed using the Gaussian method.

Further, in order to obtain the correct energy for the evaluation lattice including the metal atoms, in all calculations, a total energy is calculated in consideration of spin-polarization. Further, for efficiency of calculation, a pseudopotential method instead of an all electron method which reflects all electrons into the calculation is applied, and a basic pseudopotential for each element included in the VASP package is applied.

Next, a step of deriving the second energy (B) is described.

A silicon crystal lattice having a diamond crystal structure is prepared. The silicon crystal lattice means a 2×2×2 super cell in which a silicon unit cell having a diamond crystal structure is doubled in x, y, and z crystal axis directions, respectively. In addition, preferably, in a k-point mesh in a reciprocal space for calculating an eigenvalue of electrons, a condition including only a gamma point is used.

In particular, the silicon-based molten composition actually has an amorphous structure, but is not able to specify an atomic structure in the amorphous form and has various cases in the same composition. Accordingly, in the step of deriving the second energy according to the exemplary embodiment of the present invention, the silicon crystal lattice is assumed to be a crystal lattice having a three-dimensional periodic boundary condition, and a silicon crystal lattice having a crystalline structure is used in all energy calculations.

Figure 2:
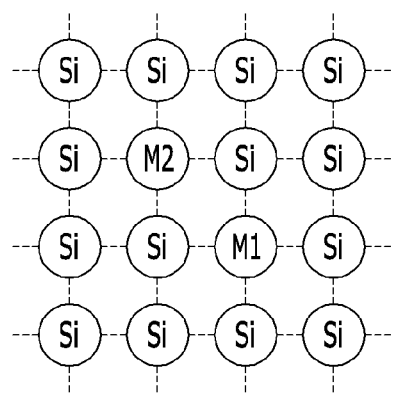
FIG. 2 is a plan view of a second evaluation lattice according to an exemplary embodiment of the present invention.

Then, one of any silicon atoms in the silicon crystal lattice is substituted with a first metal atom M1, as shown in FIG. 2. Then, any other silicon atom in the silicon crystal lattice having the substituted first metal atom M1 is substituted with a second metal atom M2.

Here, the first metal atom and the second metal atom are neighboring to each other in a column direction or in a row direction and do not bond to each other. Further, an interval between the first metal atom and the second metal atom is preferably 5 Å or less.

That is, the first metal atom and the second metal atom may be positioned to have the interval of 5 Å or less while opposing each other in a diagonal direction as shown in FIG. 2. However, the first metal atom and the second metal atom are not limited to the position, and may be positioned at any position that satisfies the above-described conditions.

Then, a structural optimization step is performed so that an interatomic force acting on the silicon atoms, the first metal atom, and the second metal atom is ±0.01 eV/Å or less. Specifically, the structural optimization step is performed by performing repeated calculation so that the force acting among the silicon atoms, the first metal atom, and the second metal atom is the above-described value. Preferably, an optimum atomic structure is sought by performing the repeated calculation until the force acting on each atom obtained through electron energy calculation is less than ±0.01 eV/Å.

In addition, in performing the structural optimization step as described above, the structural optimization is performed on the lattice positioned with a radius of 6 Å based on the silicon atom positioned between the first metal atom M1 and the second metal atom M2. After the structural optimization is completed, the crystal lattice which is positioned within the radius of 6 Å based on the silicon atom positioned between the first metal atom and the second metal atom is defined as the second evaluation lattice. The second evaluation lattice includes the first metal atom, the second metal atom, and the silicon atoms.

Lastly, the second energy B of the second evaluation lattice including the first metal atom, the second metal atom, and the silicon atoms is derived.

Here, the second energy (B) may be derived by a density functional theory (DFT) using a VASP code for a case where the second evaluation lattice is in an electronic ground state, and the same description as the method of deriving the first energy A is omitted.

The solubility parameter ($C_{si}^{sol}$) defined by Equation (1) below is calculated using the first energy A and the second energy B derived by the above-described method:

$$C_{si}^{sol} = A - B + \mu_1 - \mu_2 \qquad \text{Equation (1)}$$

The solubility parameter value as derived above indicates carbon solubility which varies depending on the metal included in the silicon-based molten composition, in a quantitative manner. When the silicon-based molten composition includes the metals that are different from each other, carbon solubilities are different, and each has a different solubility parameter value.

Here, when the solubility parameter has a negative value, it means a thermodynamically exothermic reaction, and the case where the carbon atom is positioned in the silicon crystal lattice forms a stable direction for the entire system. In particular, when the solubility parameter value is −0.37 or less, an effect of the exothermic reaction is excellent.

Accordingly, the silicon-based molten composition according to the exemplary embodiment of the present invention includes the metal in which a solubility parameter ($C_{si}^{sol}$) value is −0.37 or less, thereby improving an efficiency at which the SiC single crystal is obtained.

Hereinafter, a manufacturing method of a SiC single crystal is described. In the manufacturing method according to an exemplary embodiment of the present invention, the above-described silicon-based molten composition is used. The solubility parameter, etc., that may be explained through the above description may be omitted in the following description.

A SiC seed crystal is prepared in a graphite crucible, and an initial molten composition including silicon and a metal selected according to the above-described parameter value is introduced into the graphite crucible. The initial molten composition contains the metal to increase the carbon solubility to silicon. Here, the metal is a metal having a value of less than −0.37 with respect to the solubility parameter ($C_{si}^{sol}$) defined by Equation (1) above, and more preferably may be a metal having a value of −0.90<$C_{si}^{sol}$<−0.38 with respect to the solubility parameter ($C_{si}^{sol}$) defined by Equation (1) above.

The metal may include any metal that satisfies the solubility parameter ($C_{si}^{sol}$) value, for example, the metal may include two or more metals.

When the two or more metals have the value of −0.37 or less with respect to the solubility parameter defined by Equation (1) above, any metal combination is possible. For example, the two or more metals may include aluminum (Al), titanium (Ti), zirconium (Zr), and scandium (Sc). Specifically, the metal may include a combination of aluminum and scandium, a combination of titanium and zirconium, a combination of scandium and zirconium, a combination of scandium and titanium, a combination of scandium and chromium, etc.

The metal may have a content of 25 to 85 parts by weight based on 100 parts by weight of a total content of the silicon. When the metal has a content of 25 parts by weight or less based on 100 parts by weight of the total content of the silicon, the carbon solubility with respect to the silicon-based molten solution is low and a sufficient growth speed of the SiC single crystal is not obtained. Further, when the metal has a content of 85 parts by weight or more based on 100 parts by weight of the total content of the silicon, polycrystallization of SiC easily occurs, and thus, the single crystal may be difficult to grow. In addition, the above-described parts by weight may be satisfied even when the metal includes two or more different metals.

Accordingly, the metal may have a content of 25 to 85 parts by weight, preferably 60 to 70 parts by weight, based on 100 parts by weight of the total content of silicon, regardless of the kind of the metal.

Next, the graphite crucible into which the seed crystal and the initial molten composition are injected is heated under an inert atmosphere such as Ar, etc. Then, by heating, the carbon in the graphite crucible is melted into the initial molten composition including silicon and metal, thereby forming the silicon-based molten composition including silicon, metal and carbon.

The heating may be performed by using, for example, a heater, in a manner in which an induction coil and a susceptor are combined or a resistance heating manner, or the like, but the present invention is not limited thereto.

After the graphite crucible reaches a predetermined temperature, a temperature of in the molten solution in the graphite crucible is slowly lowered, and the carbon solubility in the molten solution is reduced. Therefore, when a SiC supersaturated state is obtained in the vicinity of the seed crystal, the SiC single crystal grows on the SiC seed crystal by using the supersaturation as a driving force.

Meanwhile, the SiC single crystal grows more by injecting silicon and carbon from the molten solution. Accordingly, the silicon and carbon included in the molten solution are gradually decreased and the condition at which the SiC is precipitated from the molten solution may vary. Here, the molten solution may be maintained within a predetermined range of composition by adding silicon and carbon to meet the composition of the molten solution as time passes. The added silicon and carbon may be injected continuously or discontinuously.

Figure 3:
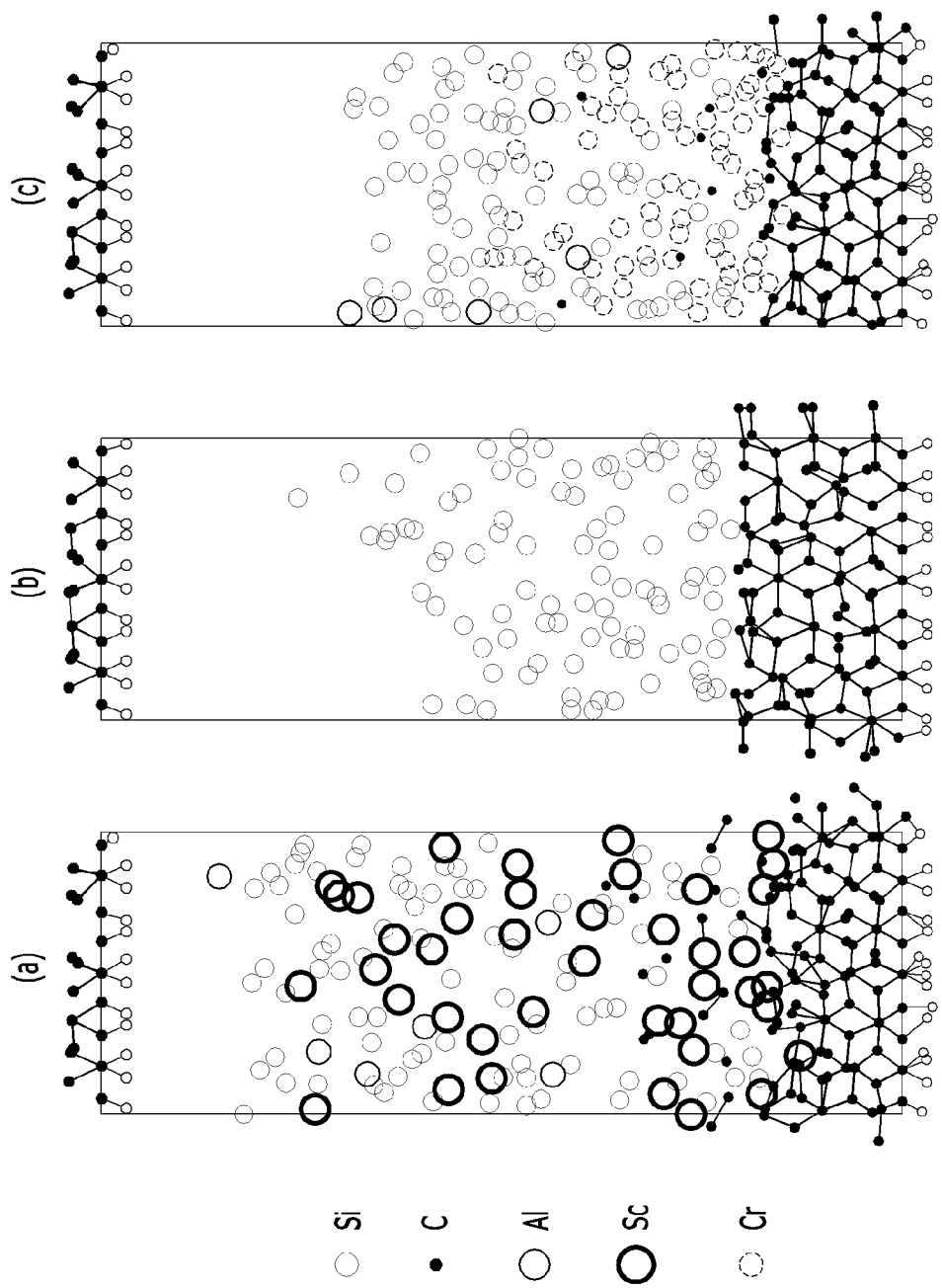
FIG. 3(a) is a simulation image of a morphology according to Example.
FIG. 3(b) is a simulation image of a morphology according to Comparative Example 1.
FIG. 3(c) is a simulation image of a morphology according to Comparative Example 2.
Figure 4:
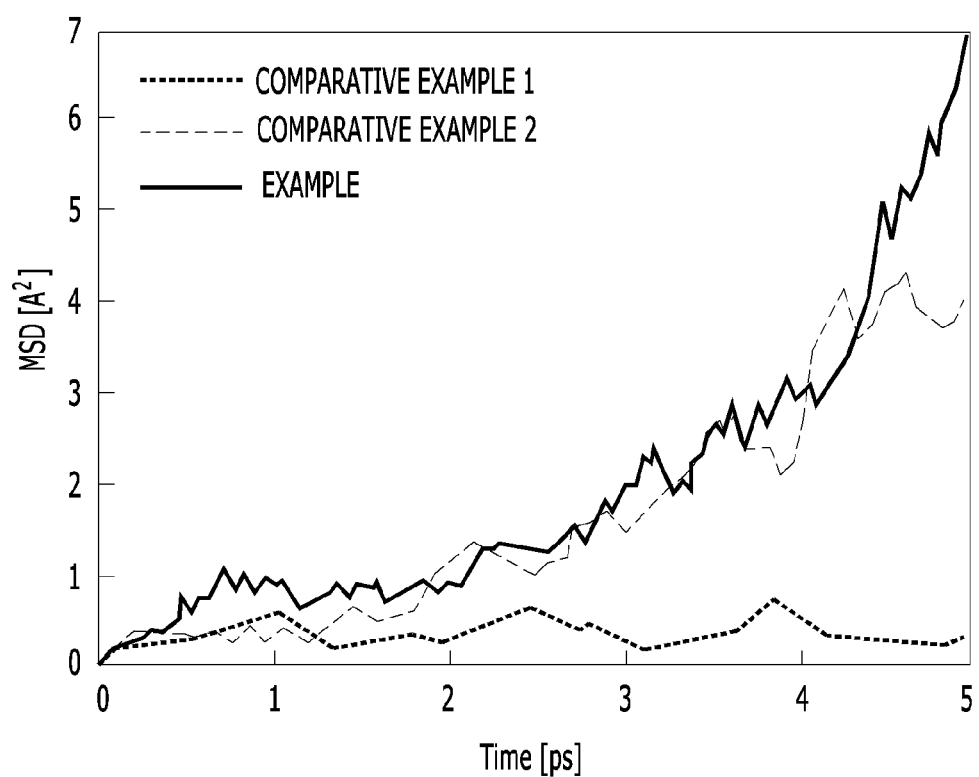
FIG. 4 shows graphs showing mean square displacements according to Example, Comparative Example 1, and Comparative Example 2.

Hereinafter, Examples and Comparative Examples according to the present invention are described with reference to FIGS. 3(a), 3(b), 3(c) to FIG. 4. FIG. 3(a) is a simulation image of a morphology according to Example, FIG. 3(b) is a simulation image of a morphology according to Comparative Example 1, and FIG. 3(c) is a simulation image of a morphology according to Comparative Example 2, and FIG. 4 shows graphs showing mean square displacements according to Example, Comparative Example 1, and Comparative Example 2.

FIG. 3 shows simulation results of carbon diffusion using ab initio molecular dynamics (AIMD) calculation. A model consisting of a graphite layer, a silicon layer and a metal layer was used to model a phenomenon that carbon is dissolved on a surface of the graphite crucible when silicon and metal are molten inside the graphite crucible. FIG. 3(a) indicating Example shows an atomic structure after 5 ps time passes under the NVT ensemble condition in which the number of atoms, system volume, and a temperature are constant by placing 48 scandium (Sc) atoms, 6 aluminum atoms and 96 silicon atoms on the surface of the graphite 110, followed by melting at a high temperature. FIG. 3(b) indicating Comparative Example 1 shows an atomic structure after 5 ps time passes under the NVT ensemble condition obtained after placing only 96 silicon atoms on the surface of the graphite 110 without adding the metal. FIG. 3(c) indicating Comparative Example 2 shows an atomic structure after 5 ps time passes under the NVT ensemble condition in which the number of atoms, system volume, and a temperature are constant by placing 72 chromium atoms, 6 aluminum atoms, and 96 silicon atoms on the surface of the graphite 110, followed by melting at a high temperature. For the AIMD calculation, the VASP code was used, and for the exchange-correlation function, which is the interaction between electrons and electrons, the GGA (generalized gradient approximation) method was used. The kinetic energy cutoff of electrons proceeded at 300 eV and only gamma-only point was used for the k-point. In particular, the carbon atom positioned at the bottom of the carbon atoms used in the modeling has a dangling bond to thereby be terminated with a hydrogen atom, and is fixed so that there is no movement during the calculation time, thereby minimizing computational errors that may occur by the periodic boundary condition. Chromium and aluminum are metals having the solubility parameter value of about 0.085 as defined by Equation (1) above, and do not correspond to Examples of the present invention.

As analysis results obtained by using the AIMD method on Example and Comparative Examples, it could be appreciated that as shown in FIG. 3, in Example (a), a considerable part of bonds between carbon atoms positioned on graphite surfaces (interface among the graphite, the silicon, and the metal molten solution) was broken by the metal atoms included in the silicon-based molten composition.

On the other hand, it could be appreciated that in Comparative Example 1(b) including only silicon, most of the bonds between carbon atoms were maintained as they are. Further, in Comparative Example 2 (c) including chromium (Cr) and Aluminum (Al), it was confirmed that the carbon bonds were partly broken, but an amount at which the carbon bonds are broken was smaller than that of Example.

It could be appreciated that when two or more metal elements (scandium and aluminum) satisfying a predetermined parameter were included as in Example of the present invention, the bonds between carbon atoms positioned on the surface of the graphite crucible were broken, and a substantial part of the carbon atoms of which the bonds were broken was dissolved in the silicon-based molten composition. Thus, in Example, the carbon solubility with respect to the silicon-based molten composition may be improved.

Hereinafter, the mean square displacements of carbon atoms according to the above-described Example, Comparative Example 1, and Comparative Example 2 are described with reference to FIG. 4. In the silicon-based molten composition including scandium and aluminum satisfying the predetermined parameter according to Example, it was confirmed that the mean square displacement value was significantly increased as time passed (5 ps).

On the other hand, at the time of using the silicon-based molten composition in which the metal other than silicon (Si) was not included as in Comparative Example 1, the mean square displacement of carbon (C) varied only between about 0 to 0.5 even though time passed.

Further, in the silicon-based molten composition including chromium and aluminum according to Comparative Example 2, it was also confirmed that the mean square displacement value was increased as time passed, but did not reach the value according to Example.

In FIG. 4 indicating that as a slope of the mean square displacement of carbon according to time is larger, the carbon solubility is excellent, it was confirmed that the graph according to Example had the greatest slope. On the other hand, the graph according to Comparative Example 1 had a slope close to zero, and the graph according to Comparative Example 2 had a predetermined slope, but the slope of Comparative Example 2 was smaller than that of Example. That is, it could be confirmed that the carbon solubility with the silicon-based molten composition according to Example was the most excellent.

Hereinafter, the carbon solubilities of carbon according to Example and Comparative Examples 1 and 2 are examined.

Example is a silicon-based molten composition including 56 at % of silicon, 40 at % of scandium, and 4 at % of aluminum, Comparative Example 1 is a silicon-based molten composition including Si, and Comparative Example 2 is a silicon-based molten composition including 56 at % of silicon, 40 at % of chromium 4, and 4 at % of aluminum.

Each molten composition was charged into a crucible made of graphite and degassed at 400□, and then the crucible was heated to form a molten solution. The heating process was performed by raising a temperature to 1800□ for 1.5 hours in an argon gas atmosphere and maintaining the temperature to 1600□ for 9 hours.

Then, the formed molten solution was cooled for 2 hours, and cooled alloy powder was taken and crushed. A carbon content included in the crushed powder was measured using a CS analyzer. Each of the measured carbon contents was shown in Table 1 below. Table 1 shows primary, secondary, and tertiary analysis results showing the carbon contents of the alloy powders obtained by using the molten compositions according to Example and Comparative Examples 1 and 2 through repeated experiments.

TABLE 1

| | Carbon at primary analysis [at %] | Carbon at secondary analysis [at %] | Carbon at tertiary analysis [at %] | Average carbon [at %] |
|---|---|---|---|---|
| Example | 47.541 | 47.332 | 45.105 | 46.659 |
| Comparative Example 1 | $<10^{-4}$ | $<10^{-4}$ | $<10^{-4}$ | $<10^{-4}$ |
| Comparative Example 2 | 4.812 | 4.532 | 3.523 | 4.289 |

Referring to Table 1, in the silicon-based molten composition according to Example, carbon having a content of 47.541 at %, 47.332 at % and 45.105 at % was detected in each of the primary, secondary and tertiary analyses, and an average carbon of 46.659 at % was detected.

However, in the molten composition according to Comparative Example 1, the carbon having a content of less than about $10^{-4}$ at % was detected three times, and in Comparative Example 2, an average carbon of 4.289 at % was detected.

It was confirmed from these results that Example had the carbon solubility higher than that of Comparative Examples, and the carbon solubility with respect to the silicon-based molten composition according to the Example was considerably excellent.

The invention claimed is:

1. A silicon-based molten composition comprising:
silicon, carbon, and a metal in which a solubility parameter ($C_{Si}^{sol}$) defined by Equation (1) below is less than −0.37,
wherein a SiC single crystal is formed by a solution method:

$$C_{Si}^{sol}=A-B+\mu 1-\mu 2 \qquad \text{Equation (1)}$$

in Equation (1) above, A is a first energy (A) of a first evaluation lattice including metal atoms, a carbon atom, and silicon atoms in a silicon crystal lattice including metal atoms and carbon atoms, B is a second energy (B) of a second evaluation lattice including metal atoms and silicon atoms in a silicon crystal lattice including metal atoms, μ1 is a constant of −5.422 as a chemical potential obtained by dividing a total energy of silicon in a diamond crystal structure into the number of silicon atoms present in a unit lattice, and μ2 is a constant of −9.097 as a chemical potential obtained by dividing a total energy of carbon in the diamond crystal structure into the number of carbon atoms present in the unit lattice,
wherein the metal includes a combination of aluminum (Al), and scandium (Sc),
wherein the solubility parameter of the combination of Al and Sc is from −0.41 to −0.39 and wherein the metal has a content of 60 to 70 parts by weight based on 100 parts by weight of a total content of the silicon.

2. A manufacturing method of a SiC single crystal comprising:
preparing a SiC seed crystal,
preparing a molten solution including silicon, carbon, and a metal, and
growing a SiC single crystal on the SiC seed crystal by supercooling the molten solution,
wherein the metal has a solubility parameter ($C_{Si}^{sol}$) of less than −0.37 as defined by Equation (1) below:

$$C_{Si}^{sol}=A-B+\mu 1-\mu 2 \qquad \text{Equation (1)}$$

in Equation (1) above, A is a first energy (A) of a first evaluation lattice including metal atoms, a carbon atom, and silicon atoms in a silicon crystal lattice including metal atoms and carbon atoms, B is a second energy (B) of a second evaluation lattice including metal atoms and silicon atoms in a silicon crystal lattice including metal atoms, μ1 is a constant of −5.422 as a chemical potential obtained by dividing a total energy of silicon in a diamond crystal structure into the number of silicon atoms present in a unit lattice, and μ2 is a constant of −9.097 as a chemical potential obtained by dividing a total energy of carbon in the diamond crystal structure into the number of carbon atoms present in the unit lattice,
wherein the metal includes a combination of aluminum (Al), and scandium (Sc),
wherein the solubility parameter of the combination of Al and Sc is from −0.41 to −0.39 and wherein the metal has a content of 60 to 70 parts by weight based on 100 parts by weight of a total content of the silicon.

3. The manufacturing method of claim 2, wherein:
an interatomic force acting on the metal atoms, the carbon atom, and the silicon atoms in the first evaluation lattice is ±0.01 eV/Å or less.

4. The manufacturing method of claim 2, wherein:
an interatomic force acting on the metal atoms and the silicon atoms in the second evaluation lattice is ±0.01 eV/Å or less.

5. The manufacturing method of claim 2, wherein:
the first energy is derived by
substituting the silicon atoms with the metal atoms in the silicon crystal lattice, and
substituting the silicon atom with the carbon atom to form the first evaluation lattice.

6. The manufacturing method of claim 5, wherein:
the second energy is derived by
substituting the silicon atoms with the metal atoms in the silicon crystal lattice to form the second evaluation lattice.

7. The manufacturing method of claim 6, wherein:
the metal atoms include a first metal atom and a second metal atom that are different from each other,
a distance between the first metal atom and the second metal atom is 5 Å or less.

8. The manufacturing method of claim 5, wherein:
the first evaluation lattice includes the carbon atom, the silicon atoms, and the metal atoms positioned within a radius of 6 Å based on the carbon atom.

9. The manufacturing method of claim 6, wherein:
the second evaluation lattice includes the silicon atoms and the metal atoms positioned within a radius of 6 Å based on the silicon atom adjacent to the metal atoms.

10. The manufacturing method of claim 2, wherein:
the first energy, the second energy, the first constant, and the second constant are derived by a density functional theory (DFT) using a VASP code.

* * * * *